Figure 1:
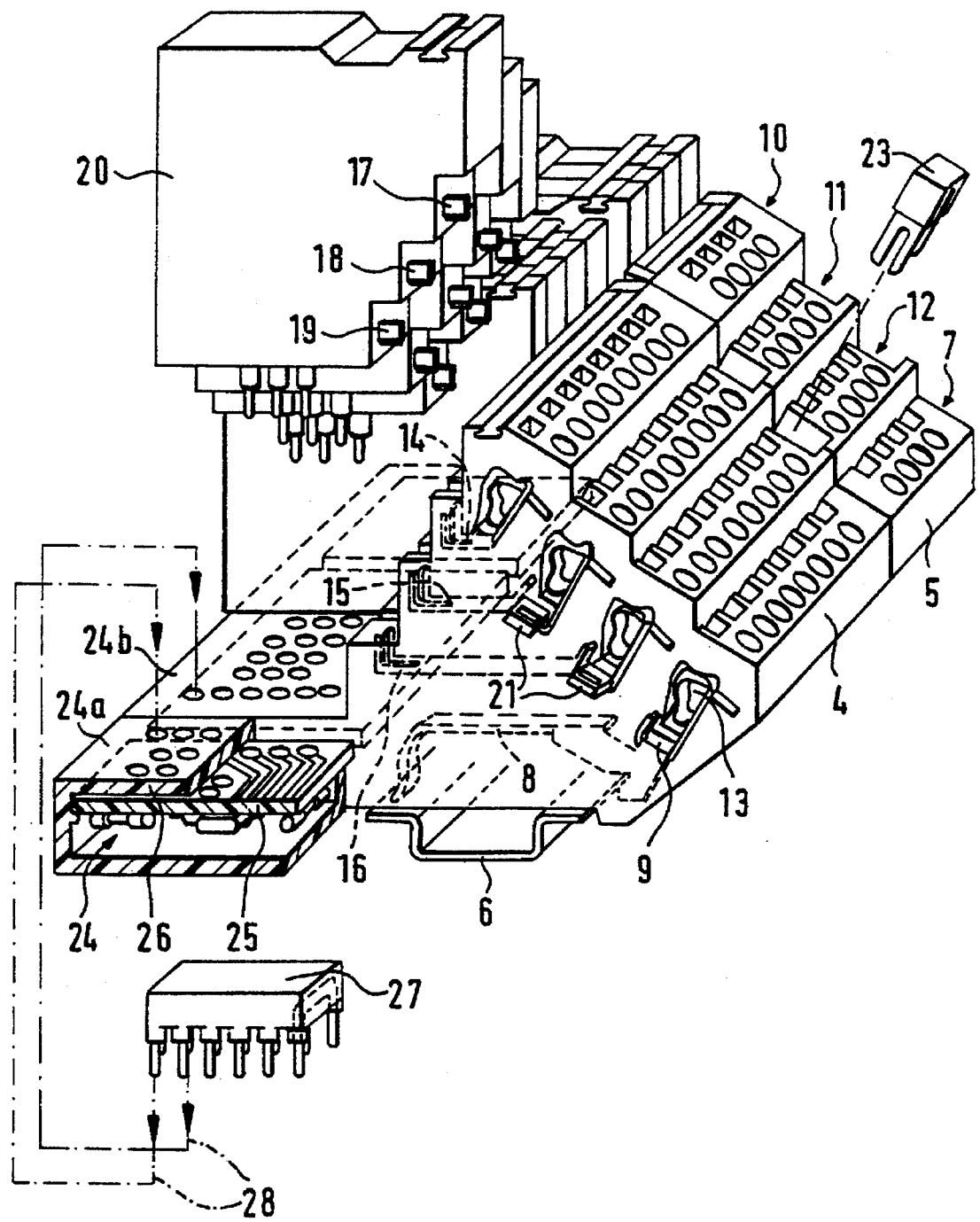

United States Patent [19]
Hohorst

[11] Patent Number: 5,641,313
[45] Date of Patent: Jun. 24, 1997

[54] I/O MODULE FOR A DATABUS

[75] Inventor: Wolfgang Hohorst, Minden, Germany

[73] Assignee: Wago Verwaltungsgellschft mbH, Minden, Germany

[21] Appl. No.: 374,932

[22] Filed: Jan. 18, 1995

[30] Foreign Application Priority Data

Jan. 18, 1994 [DE] Germany ............ 44 02 001.5

[51] Int. Cl.$^6$ ............................................. H01R 29/00
[52] U.S. Cl. ............................................. 439/709; 439/716
[58] Field of Search ............ 439/716, 49, 709, 439/50

[56] References Cited

U.S. PATENT DOCUMENTS 4,171,861  10/1979  Hohorst ................... 439/49

FOREIGN PATENT DOCUMENTS 61-0134041  6/1986  Japan ..................... 439/49

*Primary Examiner*—Neil Abrams
*Assistant Examiner*—Eugene G. Byrd
*Attorney, Agent, or Firm*—Salter & Michaelson

[57] ABSTRACT

The invention concerns I/O modules for a data bus, each of which consists of a base contact block, which can be set upon an assembly rail. Each base contact block has a flat bottom channel, in which the data bus lines and the current supply for the I/O electronics units on the circuit boards are guided, whereby I/O electronic modules for each connection plane or for individual groups of connection planes of the base contact block can be plugged into printed circuit boards arranged in the bottom channel, whereby a simple handling and a high modularity is given.

5 Claims, 2 Drawing Sheets

I/O MODULE FOR A DATABUS

The invention concerns an input/output module for a data bus, like that offered as a so-called field bus by different manufacturers in conjunction with special processor systems, industrial computers, etc., e.g. for the control, visualization, or the like, of process runs, equipment, plants, and for building systems technology.

The field bus concept represents a rational type of wiring of equipment and plants, etc. Input/output modules (I/O modules) are equipped with contact points for the parallel wiring of individual bus subscribers, which can be actors, sensors, and other miscellaneous devices. Wiring can be effected by any desired connection technology, e.g., by one, two, three, or four-conductor technology. Simple-to-operate spring contacts or even screw contacts are particularly suitable for the contact points.

The modules are equipped with an I/O electronics unit, which joins the subscribers connected to the contact points of the modules with the serial data bus line, which can be, for example, a simple two-wire conductor or even a beam waveguide cable. Thus, this data bus line connected to the I/O modules, in practice, for the most part is a self-contained sub-bus in the topology of a ring, which is coupled via a bus master to the field bus (remote bus). The bus master controls the individual I/O modules, which can be combined with each other in any arbitrary sequence, and may be arranged in any positions in the ring.

It is known to mount I/O modules onto assembly rails, in which a so-called supply rail in the form of combined printed circuit components is mounted. In addition to the two conductors for the current supply of the I/O electronics unit, three other conductors are available on the supply rail for the data bus, The conductors make contact by means of socket contacts, which are rigidly incorporated at a specific screen [grid] distance in the supply rail.

Such a supply rail mounted in the assembly rail increases not only the basic costs and assembly costs for the assembly-rail attachment of the I/O modules (unused components of the supply rail must be covered), but also prevents their modularity, since the width of the I/O module must always be a multiple of the pregiven screen [grid] distances of the socket contacts in the supply rail. In addition, the supply rail arranged in the assembly rail prevents the attachment of the assembly rail itself to a mounting surface or the like, since the screw passages necessary for this purpose are only permitted at very specific places in the supply rail, which often in practice does not conform to on-site conditions.

The above-named disadvantages for other known I/O modules, which can be mounted on assembly rails, are avoided by setting them up in a tested manner onto unmodified, commercially available assembly rails, and connecting the data bus lines and the current supply lines for the I/O electronics units from module to module in the form of a ribbon cable contact. This is a somewhat cumbersome operation for the user.

In addition, these known I/O modules are very wide. They each consist of a base contact block, which has 16, 24, or 32 connection planes with contact pieces for the parallel wiring of each bus subscriber (actor, sensor, or other device) per connection plane in the direction of the assembly rail. These connection planes are next to one another and at a parallel distance to one another. The desired modularity of the system is extensively lost with such wide I/O modules, and also all of the connection planes of one I/O module always belong only to one class (each one concerns only inputs or only outputs), since in these known I/O modules, an I/O electronic assembly is provided which can be plugged into the base contact block, which extends crosswise over the entire width of the base contact block in the direction of the assembly rail. This increases costs for the user, since an I/O module with 16, 24, or 32 connection planes must be installed, even if, for example, only one of the connection planes is required.

The task of the present invention is to further develop the above-given type of I/O module, which can be set up on unmodified, common commercial assembly rails, such that it can be handled very simply by the user and can be combined with the data bus lines and the current supply lines, whereby a high modularity will also be present, so that costs for the electronics of unnecessary connection planes can be spared.

This task is resolved according to the invention in that a flat bottom channel is provided for an I/O module with base contact block in an insulated housing of the base contact block, and this channel extends parallel to and preferably next to the assembly rail over the entire width of the base contact block. A printed circuit extended over the entire width of the base contact block is arranged in this bottom channel (preferably it is inserted into the open bottom channel on the end side), whereby the printed circuit has tracks for the data bus lines and for the current supply of the I/O electronics units such that I/O electronic modules can be plugged in from the top onto the printed circuits in order to contact the tracks. The tracks of adjacent base contact blocks set up on the assembly rail can be joined with each other by means of a U-shaped electronic bridging piece, which can also be plugged in from the top onto the end pieces of adjacent circuit boards.

The high modularity of the new I/O module is assured by the fact that its own I/O electronics module can be plugged onto printed circuit boards arranged in the bottom channel for each connection plane or for individual groups of connection planes of the same base contact block. Correspondingly, the insulated housings of the electronic modules can be designed in a relatively constricted manner in a type of disk crosswise to the longitudinal extent of the assembly rail or the base contact block, whereby the disk width corresponds appropriately to the screen [grid] distance of the connection planes of the base contact block.

With the I/O modules of the invention, a large number of contact planes for the subscriber of a data bus can be installed on a common commercial assembly rail, whereby for each individual connection plane or for specific groups of connection planes, the respective class of connection plane (input or output) can be defined subsequently, i.e., after setting up the base contact block, by plugging in a corresponding I/O electronics module. Thus one is not bound to the width of the respective base contact block. The high modularity is produced by electronics modules that can be plugged in. If a connection plane is not covered, i.e., not wired with a bus subscriber, then plugging in the I/O electronics unit for this connection plane is not necessary.

The simple use of an electronics bridging piece for joining the data bus lines and the current supply lines for the I/O electronics units is of particular advantage for the user. The electronics bridging pieces are only to be plugged into the circuit boards arranged in the bottom channel. This is a technique that is already known to the user in the form of other cross bridging systems.

According to claim 3, it is provided that the bottom channel is designed closed by means of an upper insulating wall, such that the latter covers the circuit boards and protects them from contact, and the electronic bridging pieces as well as the I/O electronic modules are plugged into the circuit boards through the upper insulating wall.

It is appropriate to arrange the electronic bridging pieces sunk into the upper insulating wall of the bottom channel, so that in the case of a flush sinking, the entire upper surface of the bottom channel is available for the arrangement of the I/O electronic modules.

The electrical joining of the I/O electronic modules to the signal connection contact points of the base contact block as well as to other contact points of the same connection plane may be realized according to claim 5 in the simplest way in that the I/O electronic modules have rigidly arranged contacts on a side surface, which does not lay opposite the bottom channel, and these contacts make a current path to the contact points of the assigned connection plane of the base contact block when the electronic modules are plugged onto the circuit boards arranged in the bottom channel.

It is a particular advantage that these make contacts, which can have a higher voltage than the electronics bridging pieces arranged on the bottom channel, have a clear distance from the bottom channel and the data bus lines accommodated therein.

It is provided according to claim 6 that the line current supply for the bus subscribers connected to the contact points by means of an internal connection is produced via the base contact blocks and that, as known in serial contacts, the internal connections between the base contact blocks, proceeding from a special feed contact, are bridged by means of known U-shaped power cross bridging pieces.

In this way, the new I/O modules retain the systems technology of cross bridging known for serial contacts, and thus the user can apply this technique uniformly in systems both for plugging in the electronic bridging pieces as well as also for plugging in the power cross-bridging pieces.

The new I/O modules can be combined onto an assembly rail, also combined with serial contacts of the known structural type and known function, if according to claim 7, the serial contacts, preferably the serial contact blocks, also have a bottom channel for insertion of circuit boards, which corresponds to the bottom channel of the I/O modules. In this case, the data bus lines and the current supply lines for the I/O modules can be joined without problem, without adversely affecting the function of the serial contacts.

Figure 2:
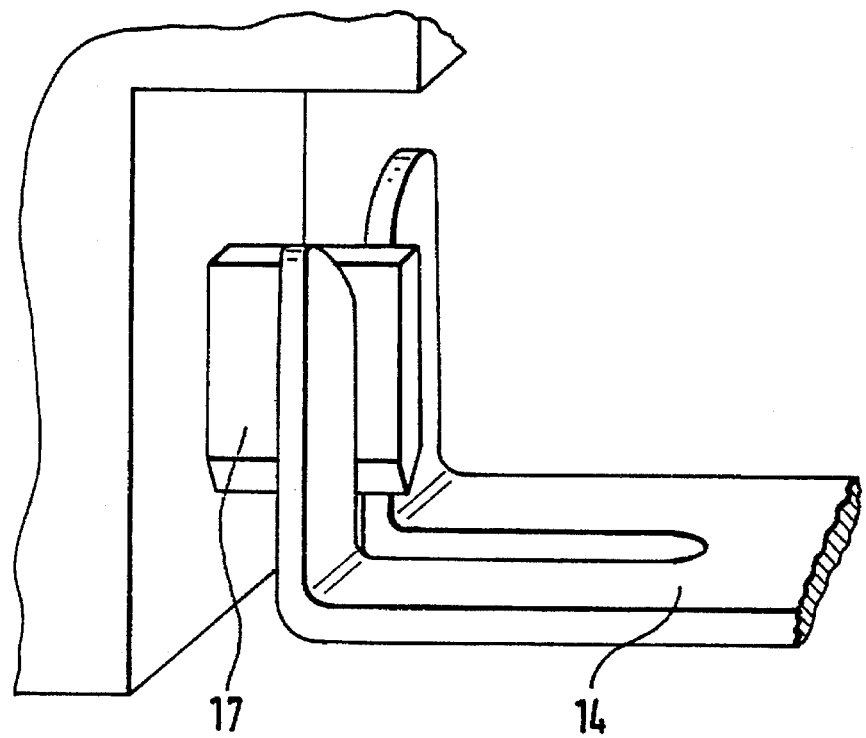
Figure 3:
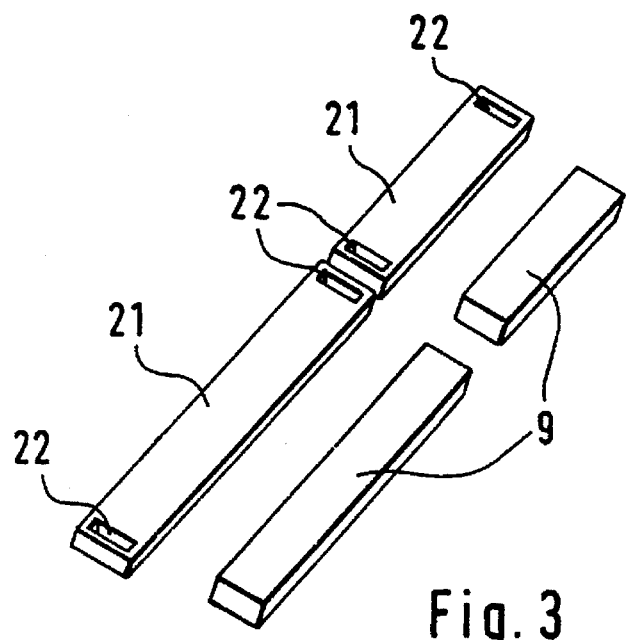

An example of embodiment of the invention is described below in more detail on the basis of the drawings. Here:

FIG. 1 shows the new I/O module in a perspective representation set up on an assembly rail, FIG. 2 shows the make contact of the I/O electronic module according to FIG. 1, FIG. 3 shows current rails for the base contact block according to FIG. 1.

Two I/O modules according to the invention are shown in FIG. 1, each of which consists of a base contact block 4 and 5 which are set up on assembly rail 6 in the known way. When these are set up, grounded conductor connection 7 also contacts assembly rail 6 via grounded conductor foot 8, as is known. Only one grounded conductor foot 8 is provided per base contact block. This is joined with all contact points of grounded conductor connections 7 by means of a current rail 9 plugged crosswise into the base contact block.

The base contact block 4, which is shown, possesses eight connection planes. Base contact block 5 set up adjacent to this on the assembly rail has only four connection planes. The connection planes extend perpendicular to the assembly rail and are arranged next to one another in the direction of the assembly rail. In the example of embodiment that is shown, four contact points are present in each connection plane; these include one signal connection 10, one (+) connection 11 one (−) connection 12, and the grounded conductor connection 7. Each contact point is designed in the known structural way as spring contacts 13 and thus requires no further description.

Contact connections 10, 11 and 12 each have current paths 14, 15, 16 extending to the left in the figure, whose fork-shaped ends are provided for uptake of make contacts 17, 18, 19 on the I/O electronic modules 20.

The (+) connections 11 and the (−) connections 12 of the connection planes of a base contact block are joined together by means of a current rail 21 plugged crosswise into the base contact block. The ends of this current rail have plug-in slots 22 see (FIG. 3), in which the power cross-bridging piece 23 can be plugged in (see FIG. 1), so that (proceeding from a known feed contact, which is not shown) the power current supply for the bus subscribers wired with the contact points of the connection planes can be bridged, if this is so provided by circuit technology.

Each base contact block has a flat bottom channel 24, as can be seen in FIG. 1 first as residual piece 24a of a base contact block (not shown), which then continues in piece 24b, which belongs to base contact block 4, which is shown. It can be seen that a printed circuit 25 is inserted in the bottom channel, and this board has the necessary tracks for the data bus lines and for the current supply of the I/O electronics units, but also can be equipped with other electronic components, if this is provided by circuit technology. In addition, more than one printed circuit can be arranged in the bottom channel, preferably inserted.

The bottom channel covers printed circuit 25 in a contact protecting manner by means of the upper insulating wall 26. The necessary plug-in openings are provided in upper insulating wall 26, so that I/O electronic modules 20 can be plugged into the printed circuit from the top in order to contact the tracks on printed circuit 25.

The tracks of base contact blocks set up adjacent to each other on the assembly rail can be joined together by means of the U-shaped electronic bridging pieces 27, which are shown, by plugging these in from above onto the end pieces of adjacent circuit boards, as this is illustrated by the dot-dash function lines 28.

The I/O electronic modules 20 have a housing width that corresponds to the screen [grid] width between the connection planes of the base contact block. Each electronic module possesses make contacts 17, 18, and 19, arranged rigidly on its side surfaces assigned to the contact points of the base contact block, and these contacts engage in the fork-shaped ends of the respective current paths 14, 15, 16 when the I/O electronics module is plugged into the circuit boards arranged in the bottom channel, as this is shown in detail in FIG. 2.

I claim:

1. Input/output modules for a data bus which can be set up on an assembly rail next to each other, each module consisting of a base contact block, which has, in the direction of the assembly rail, several connection planes next to each other and at a parallel distance to each other with contact points for the parallel wiring of a bus subscriber per connection plane, and joined with an I/O electronics device, which can be plugged into the base contact block, which device joins the bus subscriber with the serial data bus line, which passes through the base contact block, is hereby characterized in that the insulating housing of the base contact block (4, 5) has a flat bottom channel (24) which extends parallel to and next to assembly rail (6) over the entire width of the base contact block, a printed circuit board (25) extending over the entire width of the base contact block is arranged in the bottom channel, and is preferably inserted into it, and the printed board has tracks for the data bus lines and for the current supply of the I/O electronics such that the I/O electronic modules can be plugged into the printed circuit from the top in order to contact the tracks, and the tracks of the adjacent base contact block set up on the assembly rail can be combined by means of a U-shaped electronics bridging component (27), which can be plugged into the end pieces of adjacent circuit boards (25) from the top, for each connection plane or for individual groups of connection planes of one base contact block, its own I/O electronics module can be plugged into the printed circuit (25) arranged in bottom channel (24).

2. I/O modules according to claim 1 further characterized in that bottom channel (24) is designed in a closed manner by means of an upper insulating wall (26)

such that the latter covers the printed circuit in a way that protects against contact and the I/O electronics modules and the electronics bridging pieces can be plugged into the printed circuit through the upper insulating wall (26).

3. I/O modules according to claim 2 further characterized in that the electronic bridging pieces (27) are arranged sunk in the upper insulating wall (26) of the bottom channel.

4. Input/output modules for a data bus which can be set up on an assembly rail next to each other, each module comprising a base contact block, which has, in the direction of the assembly rail, several connection planes next to each other and at a parallel distance to each other with contact points for the parallel wiring of a bus subscriber per connection plane, and joined with an I/O electronics device, which can be plugged into the base contact block, which device joins the bus subscriber with the serial data bus line, which passes through the base contact block, is hereby characterized in that the insulating housing of the base contact block has a flat bottom channel which extends parallel to and next to assembly rail over the entire width of the base contact block, a printed circuit board extending over the entire width of the base contact block is arranged in the bottom channel, and is preferably inserted into it, and the printed board has tracks for the data bus lines and for the current supply of the I/O electronics such that the I/O electronic modules can be plugged into the printed circuit from the top in order to contact the tracks, and the tracks of the adjacent base contact block set up on the assembly rail can be combined by means of a U-shaped electronics bridging component, which can be plugged into the end pieces of adjacent circuit boards from the top, I/O electronic modules have on one side surface, which does not lie opposite the bottom channel, rigidly arranged contacts, which close a current path to the contact points of the assigned connection planes of the base contact block when the I/O electronic modules are plugged onto the printed circuits arranged in the bottom channel.

5. Rail-mounted input/output modules for a data bus mounted on a carrier rail next to each other, each module comprising:

a base contact block which has, in a direction of the carrier rail, several connection planes next to each other at a parallel distance to each other with contact points for the parallel wiring of a bus subscriber per connection plane, the insulating housing of the base contact block has a flat bottom channel which extends parallel to said carrier rail over the entire width of the base contact block, and a printed circuit board having tracks for the data bus lines and for the current supply to any electronics is arranged in said bottom channel and extends over the entire width of the base contact block in order that the tracks of the printed circuit board of one base contact block can be connected to the tracks of the printed circuit board of an adjacent base contact block by means of U-shaped electronic bridging elements, each connection plane of each individual groups of connection planes of said base contact block has its own I/O electronic module which can be plugged into the printed circuit board from the top in order to contact its tracks for the data bus lines and to contact its tracks for the electronics current supply as well as to connect the bus subscriber wired to the connection plane of said base contact block to the I/O electronic module associated to the same connection plane or to the same group of connection planes.

\* \* \* \* \*